United States Patent
Su et al.

(10) Patent No.: US 11,228,125 B1
(45) Date of Patent: Jan. 18, 2022

(54) APPARATUS, SYSTEM, AND METHOD FOR FACILITATING ELECTRICAL CONTINUITY BETWEEN SOCKETS AND WARPED ELECTRICAL COMPONENTS

(71) Applicant: Juniper Networks, Inc., Sunnyvale, CA (US)

(72) Inventors: Peng Su, Sunnyvale, CA (US); Aliaskar Hassanzadeh, Sunnyvale, CA (US)

(73) Assignee: Juniper Networks, Inc, Sunnyvale, CA (US)

(*) Notice: Subject to any disclaimer, the term of this patent is extended or adjusted under 35 U.S.C. 154(b) by 0 days.

(21) Appl. No.: 16/891,881

(22) Filed: Jun. 3, 2020

(51) Int. Cl.
*H01R 12/71* (2011.01)
*H01R 13/15* (2006.01)
*H01R 43/00* (2006.01)

(52) U.S. Cl.
CPC .......... *H01R 12/714* (2013.01); *H01R 13/15* (2013.01); *H01R 43/00* (2013.01)

(58) Field of Classification Search
CPC ....... H01R 12/714; H01R 13/15; H01R 43/00
USPC ........................................................... 439/68
See application file for complete search history.

(56) References Cited

U.S. PATENT DOCUMENTS

| 6,654,250 | B1* | 11/2003 | Alcoe | H05K 1/189 |
| | | | | 257/719 |
| 6,743,026 | B1* | 6/2004 | Brodsky | H05K 3/325 |
| | | | | 361/719 |
| 7,344,919 | B2* | 3/2008 | McAllister | H01L 23/3737 |
| | | | | 257/678 |
| 7,690,925 | B2* | 4/2010 | Goodman | H01R 13/2421 |
| | | | | 439/70 |
| 8,043,103 | B2* | 10/2011 | Yamada | G01R 1/045 |
| | | | | 439/219 |
| 8,297,986 | B2* | 10/2012 | Too | H01L 23/467 |
| | | | | 439/70 |
| 8,613,622 | B2* | 12/2013 | Garcia | H01R 13/2421 |
| | | | | 439/66 |
| 9,435,827 | B2* | 9/2016 | Pak | G01R 1/06722 |
| 10,256,588 | B2* | 4/2019 | Oda | G01R 1/067 |
| 10,611,139 | B2* | 4/2020 | Burgold | G01R 3/00 |

* cited by examiner

Primary Examiner — Alexander Gilman
(74) Attorney, Agent, or Firm — FisherBroyles, LLP

(57) ABSTRACT

A disclosed socket may include (1) a base that is arched to match a degree of warpage experienced by an electrical component and (2) an array of contact pins arranged across the base. A first side of the contact pins may be electrically coupled to a circuit board, and a second side of the contact pins may protrude from the base opposite the circuit board to establish contact with the electrical component despite the degree of warpage experienced by the electrical component. Various other apparatuses, systems, and methods are also disclosed.

19 Claims, 9 Drawing Sheets

APPARATUS, SYSTEM, AND METHOD FOR FACILITATING ELECTRICAL CONTINUITY BETWEEN SOCKETS AND WARPED ELECTRICAL COMPONENTS

BACKGROUND

Some electronic components, such as Land Grid Array (LGA) integrated circuits, are installed on circuit boards through sockets. For example, an LGA socket may be soldered to a circuit board during a reflow process. After completion of the reflow process, an LGA component may be installed into the LGA socket. In this example, the LGA component and the circuit board may be electrically coupled to one another through the LGA socket.

Unfortunately, some electrical components may experience a certain amount of warpage-even at room temperature. As the sizes of such electrical components continue to increase, so too may the amount of warpage experienced by these electrical components. If the warpage exceeds a certain limit, some connection terminals on the electrical components may be unable to connect to the socket and/or maintain a connection with the socket. As a result, such electrical components may fail to achieve full connectivity with the remaining electronic components laid out on the circuit board. Without full connectivity, the circuit board may fail to work as intended, leaving the corresponding computing device in which the circuit board is installed inoperable for its intended purpose.

The instant disclosure, therefore, identifies and addresses a need for apparatuses, systems, and methods for facilitating electrical continuity between sockets and warped electrical components.

SUMMARY

As will be described in greater detail below, the instant disclosure generally relates to apparatuses, systems, and methods for facilitating electrical continuity between sockets and warped electrical components. In one example, an apparatus for accomplishing such a task may include and/or represent a socket adaptive body thickness and/or shape. In this example, the socket may include (1) a base that is arched to match a degree of warpage experienced by an electrical component and (2) an array of contact pins arranged across the base. A first side of the contact pins may be electrically coupled to a circuit board, and a second side of the contact pins may protrude from the base opposite the circuit board to establish contact with the electrical component despite the degree of warpage experienced by the electrical component.

Similarly, a system for accomplishing such a task may include (1) a circuit board, (2) an electrical component that exhibits a certain degree of warpage, and (3) a socket that includes (A) a base that is arched to match the certain degree of warpage exhibited by the electrical component and (B) an array of contact pins arranged across the base. A first side of the contact pins may be electrically coupled to a circuit board, and a second side of the contact pins may protrude from the base opposite the circuit board to establish contact with the electrical component despite the degree of warpage experienced by the electrical component.

A corresponding method may include (1) determining a degree of warpage experienced by an electrical component that includes an array of contact pads, (2) manufacturing a socket that includes (A) a base that is arched to match the degree of warpage experienced by the electrical component and (B) an array of contact pins that extend through the base, (3) electrically coupling the socket to a circuit board via a first side of the contact pins, and then (4) installing the electrical component into the socket such that a second side of the contact pins establishes contact with the array of contact pads included on the electrical component.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
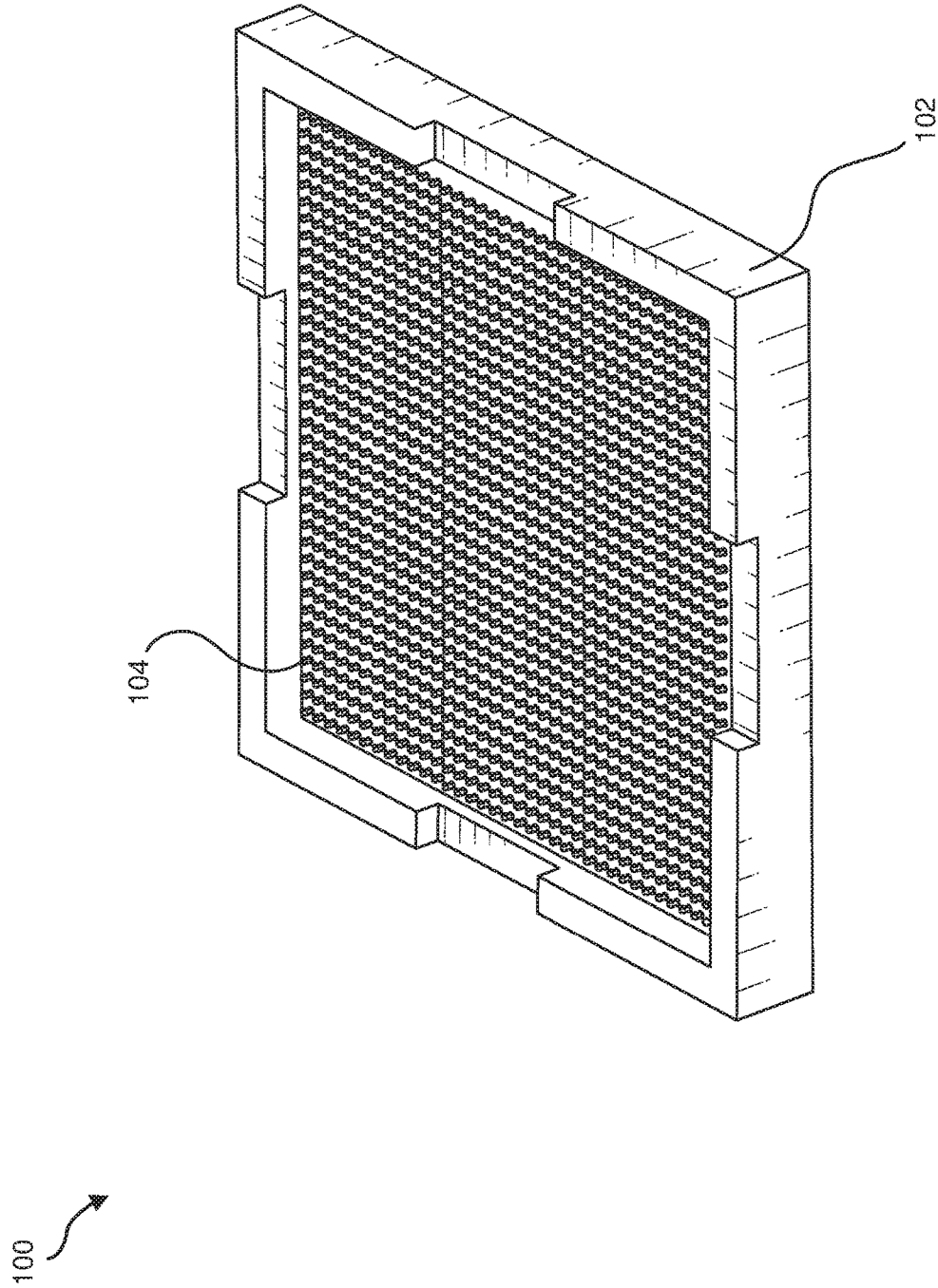
FIG. 1 is an illustration of an exemplary apparatus for facilitating electrical continuity between sockets and warped electrical components.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for facilitating electrical continuity between sockets and warped electrical components. As will be explained in greater detail below, embodiments of the instant disclosure may include and/or involve producing a socket that matches the contours and/or arching of a warped electrical component, such as an Application Specific Integrated Circuit (ASIC). For example, a device manufacturer may analyze and/or measure the contours and/or arching of a sample set of warped ASICs (e.g., between 50 and 100 warped examples and/or instances of a specific ASIC). In this example, the device manufacturer may then calculate and/or compute one or more meaningful metrics (e.g., an average and/or median amount of warpage) representative of and/or corresponding to that sample set of warped ASICs based at least in part on the analysis and/or measurements.

Continuing with this example, the device manufacturer may create, customize, and/or produce a socket (e.g., an LGA socket) that tracks and/or follows the warpage exhibited by those ASICs. By doing so, the device manufacturer may be able to install one of those ASICs in the socket such that all connection terminals on that ASIC successfully connect with the socket. As a result, the ASIC may achieve full connectivity with other electronic components laid out on the corresponding circuit board. With full connectivity, the circuit board may work as intended, thereby enabling the computing device in which the circuit board is installed to be operable for its intended purpose.

The following will provide, with reference to FIG. 1-8, detailed descriptions of an exemplary apparatuses, systems, configurations, and/or implementations for facilitating electrical continuity between sockets and warped electrical components. In addition, the discussion corresponding to FIG. 8 will provide a detailed description of an exemplary method for facilitating electrical continuity between sockets and warped electrical components.

FIG. 1 illustrates an exemplary apparatus 100 for facilitating electrical continuity between sockets and warped electrical components. As illustrated in FIG. 1, exemplary apparatus 100 may include and/or represent a socket (e.g., an LGA socket) into which an electrical component (e.g., an LGA component) is installed. In one example, apparatus 100 may include and/or represent a base 102 and an array of contact pins 104. In this example, base 102 may be arched and/or contoured to match a degree of warpage experienced and/or exhibited by an electrical component. Array of contact pins 104 may be arranged and/or disposed through or across base 102 (in, e.g., an LGA configuration and/or format).

In some examples, one side of contact pins 104 may be electrically coupled to a circuit board (not necessarily illustrated in FIG. 1). In such examples, another side of contact pins 104 may protrude and/or extend from base 102 opposite the circuit board. This other side of contact pins 104 may establish and/or make physical contact with the electrical component despite the degree of warpage experienced and/or exhibited by the electrical component.

In some examples, base 102 may include and/or represent a structure, housing, and/or connection mechanism into which the electrical component is installed. Accordingly, base 102 may lock the electrical component into place on the circuit board. In other words, base 102 may physically maintain and/or hold the electrical component against the circuit board.

Base 102 may be of various shapes and/or dimensions. In some examples, base 102 may form a square, a rectangle, and/or a cube. Additional examples of shapes formed by base 102 include, without limitation, ovals, circles, variations or combinations of one or more of the same, and/or any other suitable shapes.

Base 102 may be sized in a particular way to house a certain electrical component within a computing device. Base 102 may include and/or contain any of a variety of materials. Examples of such materials include, without limitation, metals, plastics, ceramics, polymers, composites, variations or combinations of one or more of the same, and/or any other suitable materials.

In addition to its mechanical structure and purpose, apparatus 100 may also serve as an electrical interface between the electrical component and the circuit board. For example, base 102 may support and/or hold array of contact pins 104 in place relative to the electrical component to facilitate electrical continuity between the electrical component and the circuit board. In this example, array of contact pins 104 may carry and/or transfer electrical and/or power signals between the electrical component and the circuit board.

In some examples, array of contact pins 104 may include and/or represent a plurality of conductors incorporated into and/or arranged across base 102. In such examples, array of contact pins 104 may be spaced a certain distance and/or pitch (e.g., approximately 1 millimeter) from one another on base 102. In one example, each contact pin may include and/or represent a single conductive piece and/or unit that facilitates electrical continuity between a contact pad on the electrical component and a conductive trace on the circuit board. For example, each contact pin may be individually placed, installed, and/or inserted into a corresponding hole formed in based 102 by way of an interference fit, a tension fit, a press fit, and/or a slip fit.

In another example, each contact pin may include and/or represent an assembly of discrete conductive pieces and/or parts that combine to facilitate electrical continuity between a contact pad on the electrical component and a conductive trace on the circuit board. In this example, a set of discrete parts or units may be coupled together by an attachment mechanism and/or fusion technique to form each contact pin. For example, the portion of a contact pin that spans and/or passes through base 102 may include and/or represent a first piece or part of that contact pin, and the portion of that contact pin that protrudes and/or extends from the top of base 102 toward the electrical component may include and/or represent a second piece or part of that contact pin. In this example, the first piece or part of that contact pin may be incorporated into and/or set within a corresponding hole formed in based 102. The second piece or part of that contact pin may then be individually placed, installed, and/or inserted into the first piece or part of that contact pin by way of an interference fit, a tension fit, a press fit, and/or a slip fit.

In some examples, at least a portion of some contact pins may include and/or represent a spring that forces and/or pressurizes such contact pins to remain electrically coupled to the corresponding contact pads on the electrical component. For example, one or more of contact pins 104 may include and/or represent spring-loaded contact pins. In one example, the portion of such contact pins that protrudes and/or extends from the top of base 102 toward the electrical component may be spring-loaded to ensure that those contact pins remain electrically coupled to the corresponding contact pads on the electrical component.

Each of contact pins 104 may be of any suitable shape and/or dimensions. In some examples, array of contact pins 104 may be shaped and/or contoured to match and/or accommodate the layout of the electrical component. Additionally or alternatively, array of contact pins 104 may be shaped and/or contoured to account and/or compensate for a certain degree of warpage exhibited by the electrical component. In one example, each of contact pins 104 may include various bends, turns, levels (e.g., differing elevations), and/or segments.

Each of contact pins 104 may be sized in a particular way to ensure electrical continuity between a contact pad on the electrical component and a conductive trace on the circuit board despite the degree of warpage exhibited by the electrical component. Each of contact pins 104 may include and/or represent any type or form of conductive material. In one example, each of contact pins 104 may include and/or represent a copper wire, lead, and/or structure. Examples of conductive materials include, without limitation, coppers, steels, alloys, silvers, nickels, aluminums, variations or combinations of one or more of the same, and/or any other suitable type of conductive materials.

Figure 2:
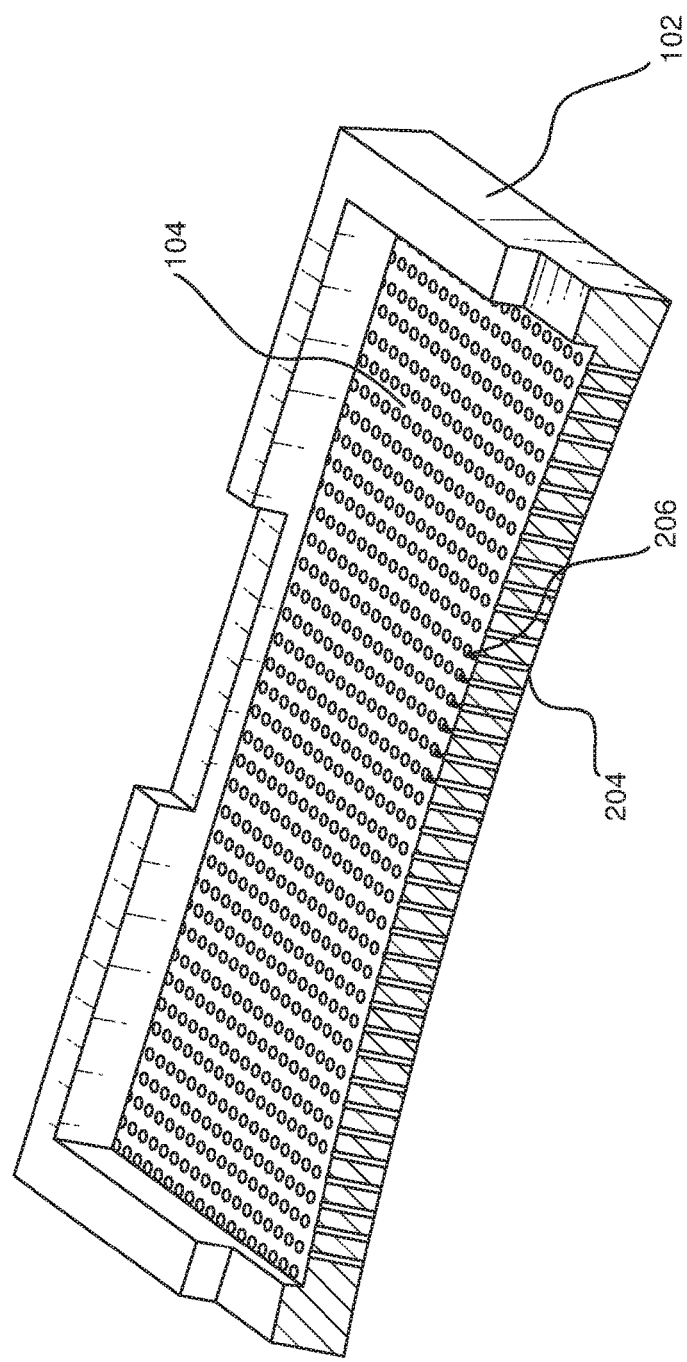
FIG. 2 is a cross-section illustration of an exemplary apparatus for facilitating electrical continuity between sockets and warped electrical components.

FIG. 2 illustrates a cross section of exemplary apparatus 100 for facilitating electrical continuity between sockets and warped electrical components. As illustrated in FIG. 2, exemplary apparatus 100 may include and/or represent array of contact pins 104 disposed and/or arranged throughout base 102. In this example, each of contact pins 104 may include and/or represent a board-side terminal 204 that electrically couples to a circuit board and a component-side terminal 206 that electrically couples to a contact pad on an electrical component.

In some examples, board-side terminal 204 may be located and/or positioned on the side where contact pins 104 are electrically coupled to the circuit board and/or opposite the other side where contact pins 104 are electrically coupled to the electrical component. In such examples, component-side terminal 206 may be located and/or positioned on the side where contact pins 104 are electrically coupled to the electrical component and/or opposite the other side where contact pins 104 are electrically coupled to the circuit board.

Figure 3:
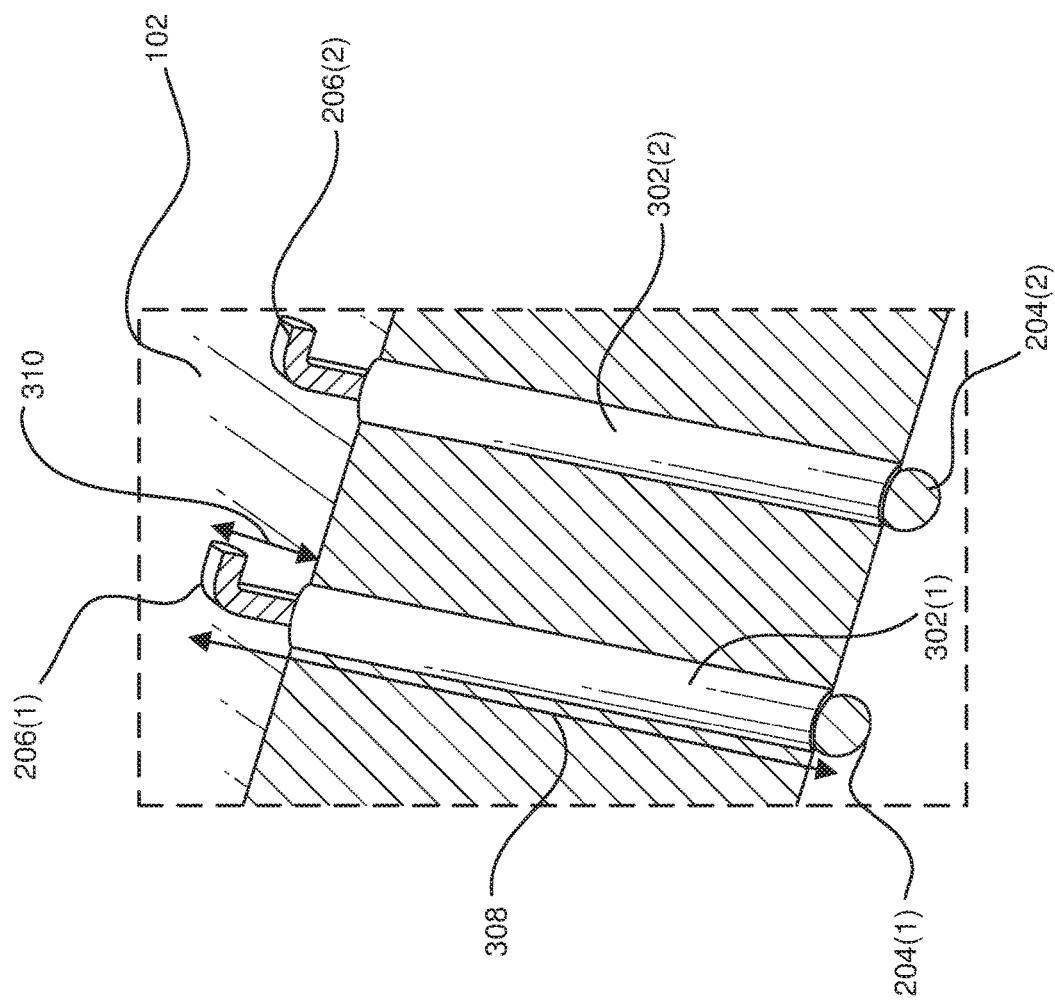
FIG. 3 is a close-up illustration of exemplary contact pins arranged on a socket base that facilitates electrical continuity with a warped electrical component.

FIG. 3 illustrates a close-up representation 300 of a portion of an exemplary socket that facilitates electrical continuity between a circuit board and a warped electrical component. As illustrated in FIG. 3, close-up representation 300 may depict a portion of the socket that includes contact pins 302(1) and 302(2) disposed in and/or running through base 102. In some examples, array of contact pins 104 may all include and/or incorporate a portion, section, and/or part that protrudes, extends, and/or rises from or above base 102 by a certain height or distance. In such examples, each of contact pins 104 may uniformly protrude, extend, and/or rise from or above base 102 by the same distance or height irrespective of the varying heights and/or arching of base 102. For example, each of contact pins 104 may maintain and/or extend a height and/or length of approximately 200 microns above base 102. Accordingly, even as certain areas of base 102 exhibit varying heights that contour to the warpage of the electrical component, array of contact pins 104 may all maintain a relatively uniform height and/or elevation above base 102.

As illustrated in FIG. 3, contact pins 302(1) and 302(2) may each protrude, extend, and/or rise from or above base 102 by a height 310. However, the total height of contact pins 302(1) and 302(2) may vary slightly relative to one another to accommodate the warpage exhibited by the electrical component. For example, contact pin 302(1) may have a total height 308, spanning from component-side terminal 206(1) to board-side terminal 204(1). In this example, contact pin 302(2) may have a slightly different height than contact pin 302(1), spanning from component-side terminal 206(2) to board-side terminal 204(2).

As illustrated in FIG. 3, board-side terminal 204(1) of contact pin 302(1) may interface with and/or electrically couple to a conductive trace on the circuit board. In this example, component-side terminal 206(1) of contact pin 302(1) may interface with and/or electrically couple to a contact pad on the electrical component. Additionally or alternatively, board-side terminal 204(2) of contact pin 302(2) may interface with and/or electrically couple to another conductive trace on the circuit board. In this example, component-side terminal 206(2) of contact pin 302(2) may interface with and/or electrically couple to another contact pad on the electrical component.

In some examples, board-side terminals 204(1) and 204(2) may each be electrically coupled to the circuit board using any suitable soldering technique. For example, board-side terminals 204(1) and 204(2) may each be soldered to the circuit board via solder balls. In this example, the solder balls may be temporarily put into a molten state during a reflow process. After completion of the reflow process, the reflowed solder may solidify to form permanent solder joints that provide electrical continuity between the contact pins and the corresponding conductive traces on the circuit board.

Figure 4:
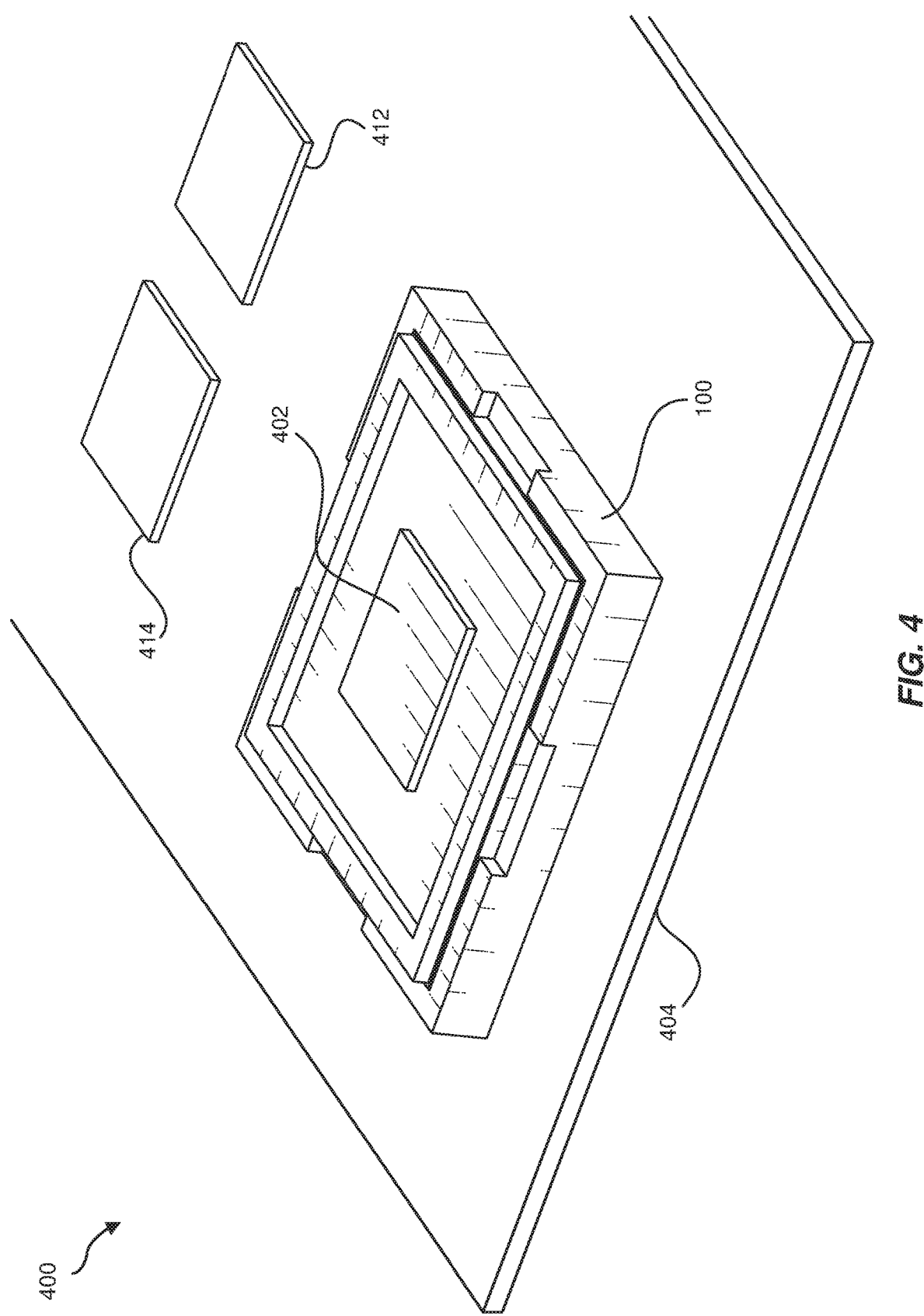
FIG. 4 is an illustration of an exemplary system for facilitating electrical continuity between sockets and warped electrical components.

FIG. 4 illustrates an exemplary system 400 for facilitating electrical continuity between sockets and warped electrical components. As illustrated in FIG. 4, exemplary system 400 may include and/or represent apparatus 100 electrically coupled to a circuit board 404 via array of contact pins 104. In some examples, system 400 may also include and/or represent an electrical component 402 that is installed and/or electrically coupled to apparatus 100 via array of contact pins 104. In one example, system 400 may further include and/or represent an electrical component 412 and/or an electrical component 414 attached and/or coupled to circuit board 404. In this example, circuit board 404 may include and/or incorporate conductive traces that carry and/or deliver electrical and/or power signals between electrical component 402 installed in apparatus 100 and electrical components 412 and 414.

Electrical components 402, 412, and 414 may each include and/or represent any type or form of component, device, and/or circuit. In one example, electrical component 402 may be formatted as and/or incorporated in an LGA package. Examples of electrical components 402, 412, and 414 include, without limitation, ASICs, Systems on a Chip (SoCs), Central Processing Units (CPUs), microprocessors, microcontrollers, Field-Programmable Gate Arrays (FPGAs) that implement softcore processors, integrated circuits, routing engines, forwarding engines, portions of one or more of the same, variations or combinations of one or more of the same, and/or any other suitable electrical components.

Figure 5:
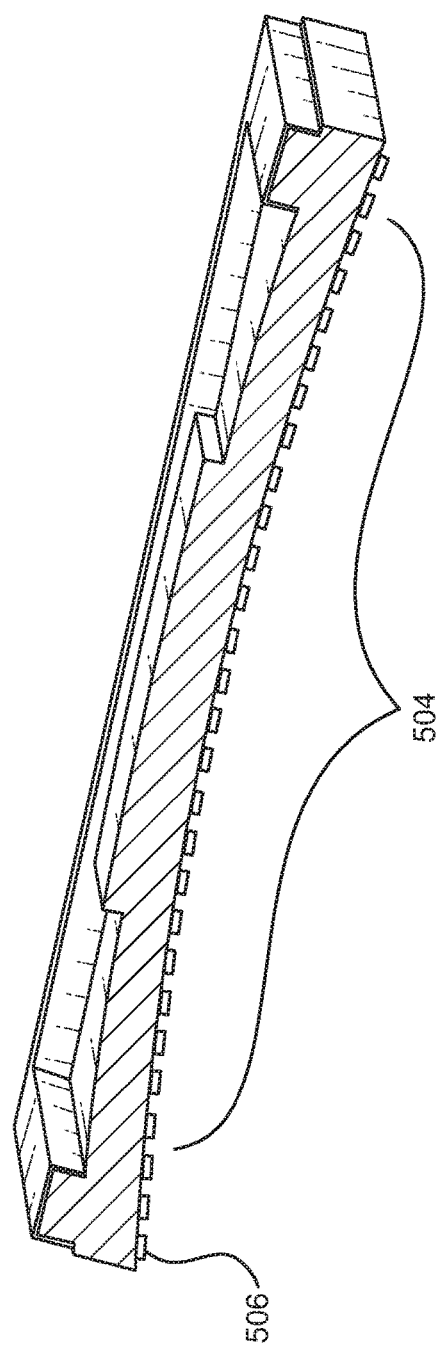
FIG. 5 is a cross-section illustration of an exemplary warped electrical component.

FIG. 5 illustrates an exemplary representation of electrical component 402. As illustrated in FIG. 5, electrical component 402 may exhibit and/or experience a certain amount or degree of warpage 504—even at room temperature. In some examples, warpage 504 of electrical component 402 may constitute and/or involve arching, bending, and/or curving that prevents electrical component 402 from maintaining a straight edge and/or plane on the side that interfaces with a corresponding socket (e.g., apparatus 100). Additionally or alternatively, electrical component 402 may include and/or incorporate an array of contact pads 506 that coincide with and/or correspond to array of contact pins 104 on apparatus 100. In one example, array of contact pads 506 may be arranged and/or disposed on electrical component 402 in an LGA configuration and/or format.

In some examples, warpage 504 of electrical component 402 may include and/or represent concave-shaped warpage. In other examples, warpage 504 of electrical component 402 may include and/or represent convex-shaped warpage.

Figure 6:
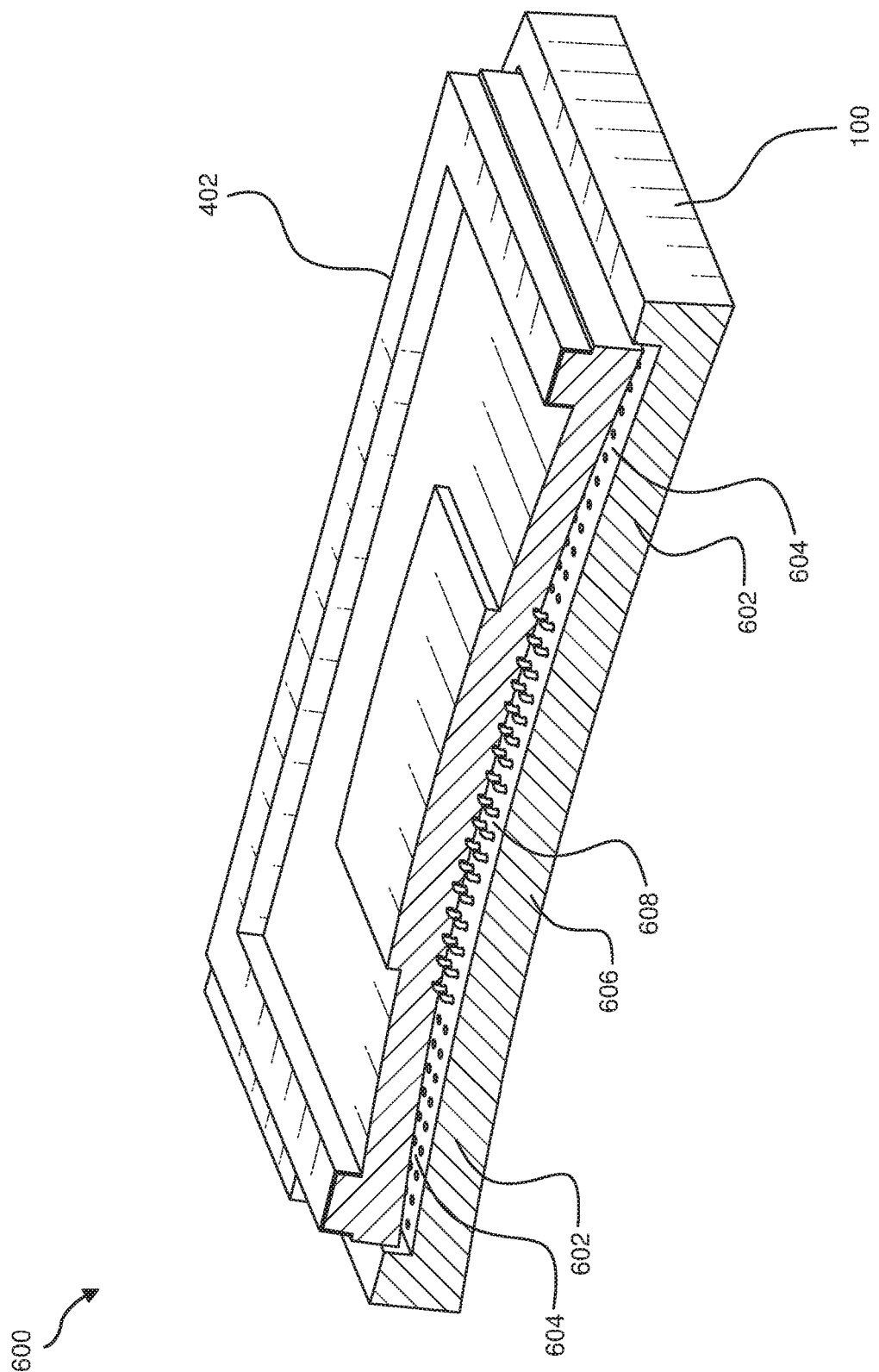
FIG. 6 is an illustration of an additional exemplary system for facilitating electrical continuity between sockets and warped electrical components.

FIG. 6 illustrates a cross section of an exemplary system 600 for facilitating electrical continuity between sockets and warped electrical components. As illustrated in FIG. 6, exemplary system 600 may include and/or represent electrical component 402 installed and/or inserted into apparatus 100. In some examples, array of contact pads 506 on electrical component 402 and array of contact pins 104 on apparatus 100 may be electrically coupled to one another upon the installation and/or insertion of electrical component 402. In one example, base 102 of apparatus 100 may include and/or represent regions of varying heights relative to a circuit board (not necessarily illustrated in FIG. 6) to which apparatus 100 is attached and/or electrically coupled. For example, base 102 may include and/or represent a border region 602 that is elevated and/or raised one distance from the circuit board, and a center region 606 that is elevated and/or raised another distance from the circuit board.

In some examples, the varying heights of the base's regions may be defined and/or formed by a continuous line and/or gradient. In other words, the contour across these regions of base 102 may appear as a continuous line, as opposed to discrete and/or disparate regions demarcated by an obvious jump in height from one region to another.

In some examples, if electrical component 402 experiences and/or exhibits concave-shaped warpage, base 102 may form and/or provide a convex-shaped arch to complement and/or fit the concave-shaped warpage of electric component 402. In other examples, if electrical component 402 experiences and/or exhibits convex-shaped warpage, base 102 may form and/or provide a concave-shaped arch to complement and/or fit the concave-shaped warpage of electric component 402.

In one example, and as illustrated in FIG. 6, center region 606 may have a greater height and/or distance than border region 602 above the circuit board. In this example, base 102 may be arched and/or contoured from border region 602 to center region 606 such that center region 606 is elevated and/or raised above or relative to border region 602.

In another example, although not necessarily illustrated in this way in FIG. 6, border region 602 may have a greater height and/or distance than center region 606 above the circuit board. In this example, base 102 may be arched and/or contoured from center region 606 to border region 602 such that border region 602 is elevated and/or raised above or relative to center region 606. The varying heights of these regions may depend on and/or be influenced by the direction and/or degree of warpage experienced or exhibited by electrical component 402.

As illustrated in FIG. 6, system 600 may include and/or represent a group of contact pins 604 arranged and/or disposed in or along border region 602 of base 102. In some examples, system 600 may also include and/or represent another group of contact pins 608 arranged and/or disposed in or along center region 606 of base 102. In one example, and as illustrated in FIG. 6, group of contact pins 608 at center region 606 may have a greater total height and/or length than group of contact pins 604 at border region 602. In another example, although not necessarily illustrated in this way in FIG. 6, group of contact pins 604 at border region 602 may have a greater total height and/or length than group of contact pins 608 at center region 606. The varying total heights and/or lengths of these contact pins may depend on and/or be influenced by the direction and/or degree of warpage experienced or exhibited by electrical component 402.

In some examples, array of contact pins 104 may have varying heights that track and/or follow the arching and/or contours of base 102. For example, array of contact pins 104 may form, constitute, and/or represent a gradient in which the heights of the individual contact pins gradually increase from border region 602 toward center region 606. Additionally or alternatively, this gradient may include and/or involve the heights of the individual contact pins gradually decreasing from center region 606 toward border region 602.

In an alternative example in which the direction of warpage is reversed and/or inverted, array of contact pins 104 may form, constitute, and/or represent a gradient in which the heights of the individual contact pins gradually increase from center region 606 toward border region 602. Additionally or alternatively, this gradient may include and/or involve the heights of the individual contact pins gradually decreasing from border region 602 toward center region 606.

Figure 7:
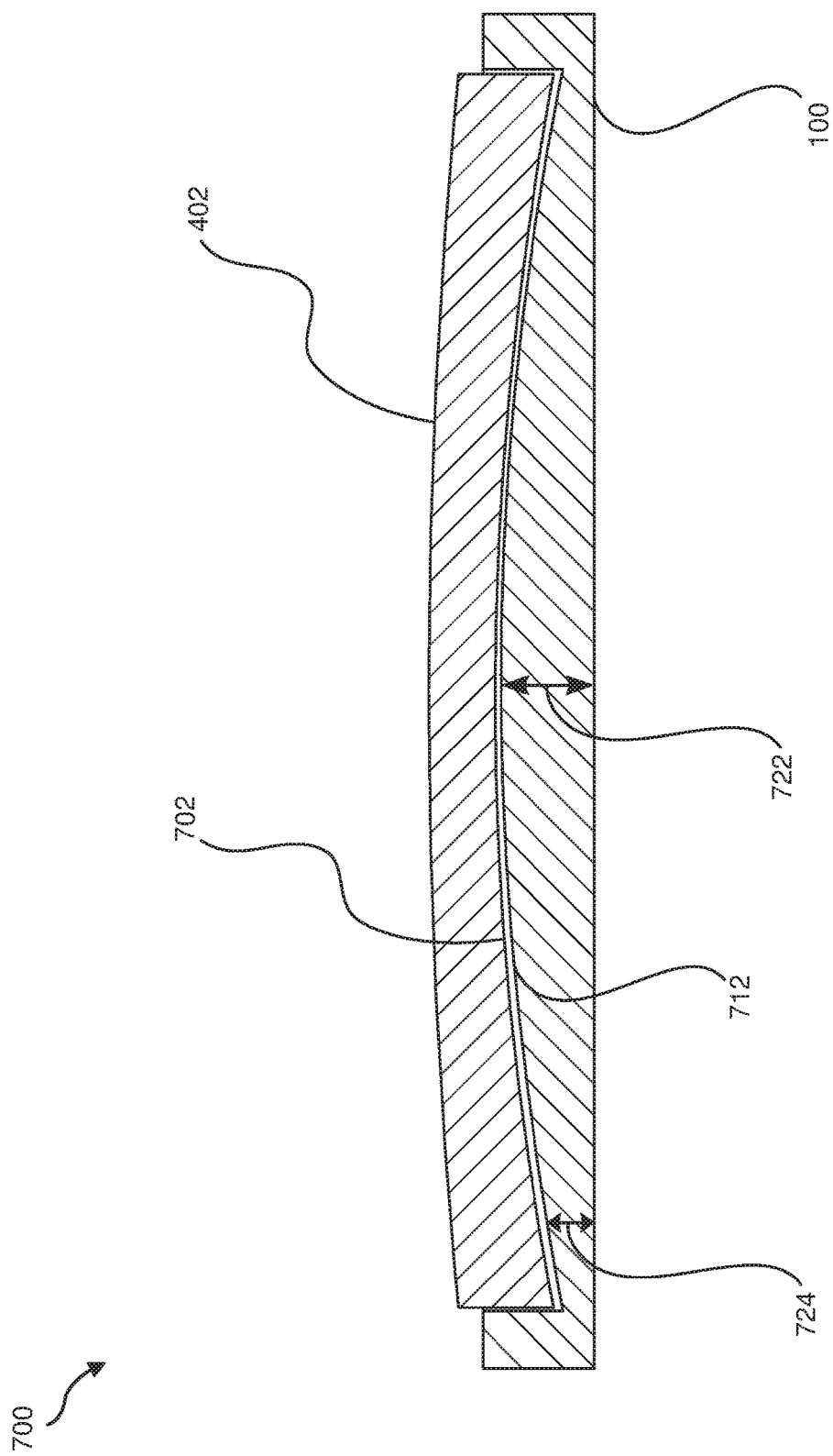
FIG. 7 is an illustration of an additional exemplary system for facilitating electrical continuity between sockets and warped electrical components.

FIG. 7 illustrates an exemplary system 700 for facilitating electrical continuity between sockets and warped electrical components. As illustrated in FIG. 7, exemplary system 700 may include and/or represent electrical component 402 installed and/or inserted into apparatus 100. In some examples, electrical component 402 may experience and/or exhibit a certain amount and/or degree of concave warpage 702. In one example, apparatus 100 may include and/or represent a socket whose base is convexly arched and/or contoured to match concave warpage 702 of electrical component 402. Accordingly, the base may include, form, and/or exhibit a convex arch 712 contoured to match concave warpage 702 of electrical component 402.

As illustrated in FIG. 7, the base of apparatus 100 may include and/or represent regions of varying heights. For example, the base may include and/or represent a border region having a height 724. In this example, the base may also include and/or represent a center region having a height 722. In one example, height 722 of the center region may be greater and/or higher than height 724 of the border region. In this example, the base may be arched to form a gradient of varying heights across the border and center regions. However, despite this gradient of varying heights across the base, the height and/or length that the contact pins of apparatus 100 extend and/or protrude above the base may remain relative constant and/or the same across the border and center regions.

Figure 8:
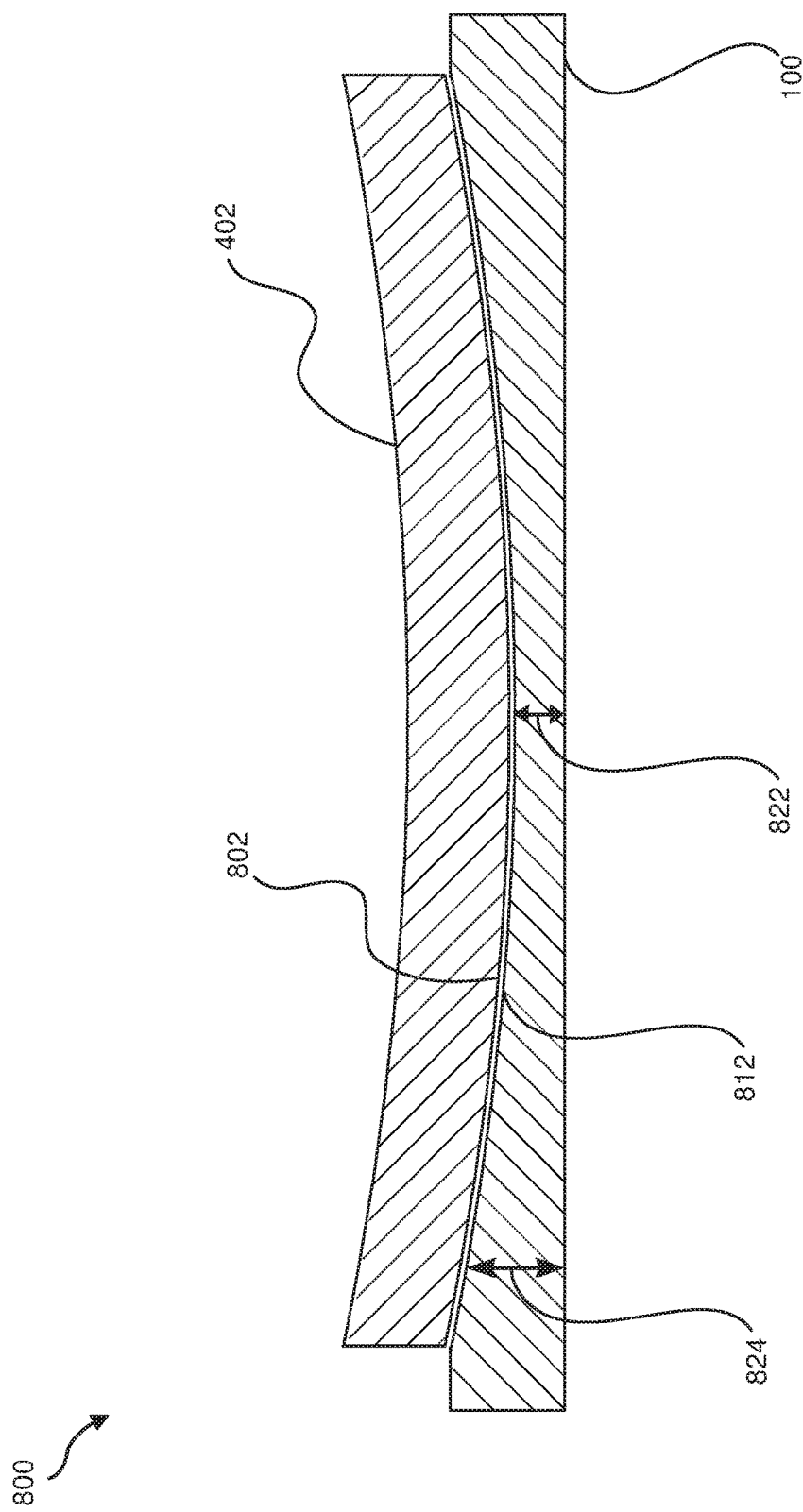
FIG. 8 is an illustration of an additional exemplary system for facilitating electrical continuity between sockets and warped electrical components.

FIG. 8 illustrates an exemplary system 800 for facilitating electrical continuity between sockets and warped electrical components. As illustrated in FIG. 8, exemplary system 800 may include and/or represent electrical component 402 installed and/or inserted into apparatus 100. In some examples, electrical component 402 may experience and/or exhibit a certain amount and/or degree of convex warpage 802. In one example, apparatus 100 may include and/or represent a socket whose base is concavely arched and/or contoured to match convex warpage 802 of electrical component 402. Accordingly, the base may include, form, and/or exhibit a concave arch 812 contoured to match convex warpage 802 of electrical component 402.

As illustrated in FIG. 8, the base of apparatus 100 may include and/or represent regions of varying heights. For example, the base may include and/or represent a border region having a height 824. In this example, the base may also include and/or represent a center region having a height 822. In one example, height 822 of the center region may be greater and/or higher than height 824 of the border region. In this example, the base may be arched to form a gradient of varying heights across the border and center regions.

However, despite this gradient of varying heights across the base, the height and/or length that the contact pins of apparatus 100 extend and/or protrude above the base may remain relative constant and/or the same across the border and center regions.

Figure 9:
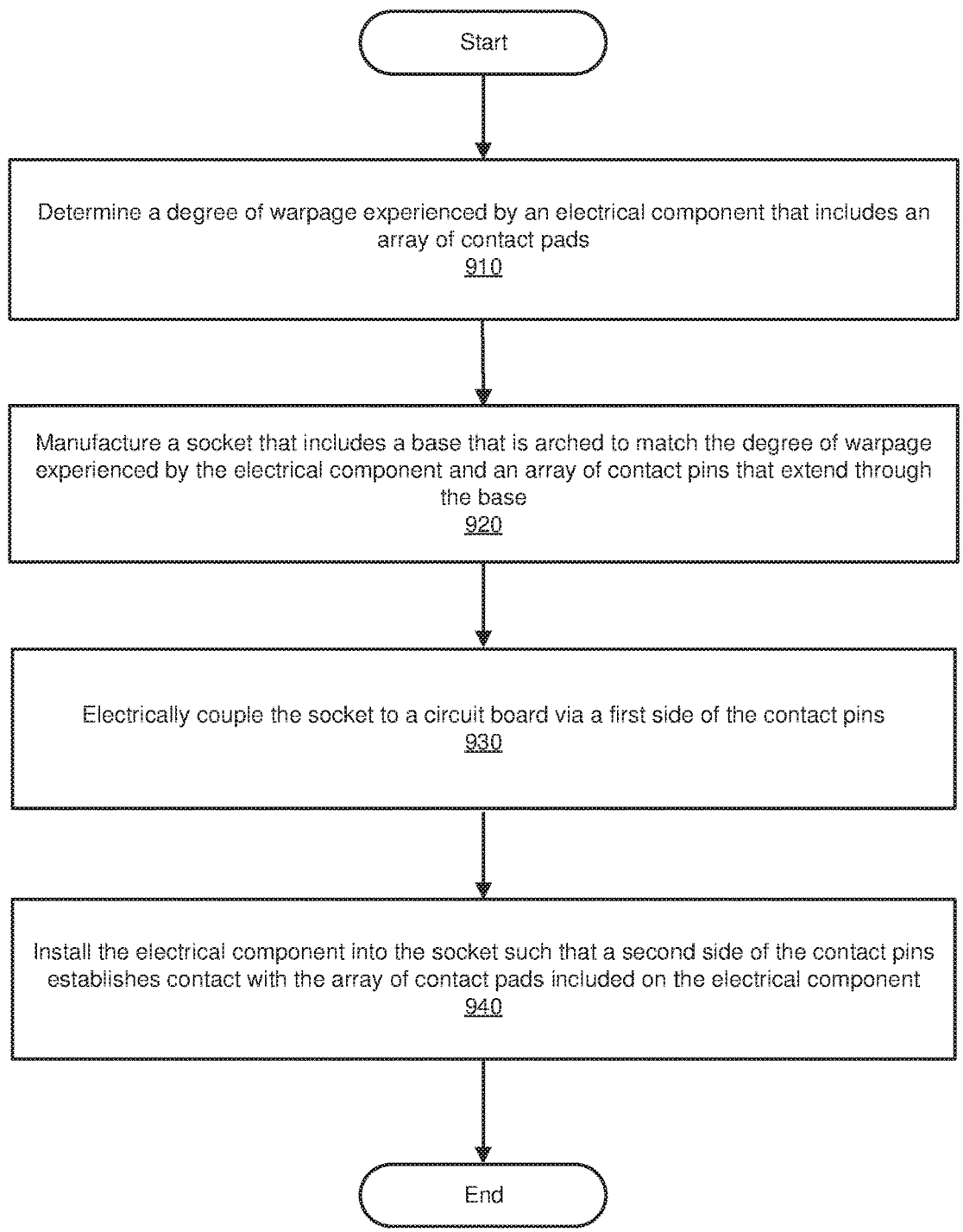
FIG. 9 is a flow diagram of an exemplary method for facilitating electrical continuity between sockets and warped electrical components.

FIG. 9 is a flow diagram of an exemplary method 900 for facilitating electrical continuity between sockets and warped electrical components. Method 900 may include the step of determining a degree of warpage experienced by an electrical component that includes an array of contact pads (910). Step 910 may be performed in a variety of ways, including any of those described above in connection with FIGS. 1-8. For example, a computing equipment manufacturer or subcontractor may analyze and/or measure the contours and/or arching of a sample set of warped ASICs (e.g., between 50 and 100 warped examples and/or instances of a specific ASIC). In this example, the computing equipment manufacturer or subcontractor may calculate and/or compute one or more meaningful metrics (e.g., an average and/or median amount of warpage) representative of and/or corresponding to that sample set of warped ASICs based at least in part on the analysis and/or measurements. The computing equipment manufacturer or subcontractor may then determine, estimate, and/or predict the degree of warpage likely experienced and/or exhibited by another example and/or instance of that ASIC based at least in part on the calculation and/or computation.

Method 900 may also include the step of manufacturing a socket that includes a base arched to match the degree of warpage experienced by the electrical component and an array of contact pins that extend through the base (920). Step 920 may be performed in a variety of ways, including any of those described above in connection with FIGS. 1-8. For example, the computing equipment manufacturer or subcontractor may create, mold, and/or form an LGA socket that is fitted to accept and/or hold that other example and/or instance of the ASIC. In this example, the LGA socket may include and/or represent a base customized to track and/or follow the warpage likely experienced and/or exhibited by the ASIC. The LGA socket may also include and/or represent an array of contact pins that extend and/or run through the base.

Method 900 may further include the step of electrically coupling the socket to a circuit board via a first side of the contact pins (930). Step 930 may be performed in a variety of ways, including any of those described above in connection with FIGS. 1-8. In one example, the computing equipment manufacturer or subcontractor may attach and/or electrically couple the LGA socket to a circuit board via one side of the contact pins. For example, the computing equipment manufacturer or subcontractor may solder one side of the contact pins incorporated into the LGA socket to the circuit board.

Method 900 may further include the step of installing the electrical component into the socket such that a second side of the contact pins establishes contact with the array of contact pads included on the electrical component (940). Step 940 may be performed in a variety of ways, including any of those described above in connection with FIGS. 1-8. In one example, the computing equipment manufacturer or subcontractor may install, insert, and/or plug the ASIC into the LGA socket such that the other side of the contact pins establishes and/or makes physical contact with the contact pads on the ASIC. By doing so, the computing equipment manufacturer or subcontractor may be able to ensure that all connection terminals on the ASIC successfully connect with and/or electrically couple to the LGA socket. As a result, the ASIC may achieve full connectivity with other electronic components laid out on the circuit board. With full connectivity, the circuit board may work as intended, thereby enabling the computing device in which the circuit board is installed to be operable for its intended purpose.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A socket comprising:
    a base that is arched along a continuous gradient to match a degree of warpage experienced by an electrical component; and
    an array of contact pins arranged across the base, wherein:
        a first side of the contact pins is electrically coupled to a circuit board;
        a second side of the contact pins protrudes from the base opposite the circuit board to establish contact with the electrical component despite the degree of warpage experienced by the electrical component; and
        the array of contact pins have varying heights that:
            follow the arch of the base; and
            gradually increase from a border region of the base toward a center region of the base along the continuous gradient.

2. The socket of claim 1, wherein:
the border region is elevated a first distance from the circuit board; and
the center region is elevated a second distance from the circuit board, the second distance being greater than the first distance.

3. The socket of claim 2, wherein the array of contact pins comprises:
a first group of contact pins that:
are arranged in the border region of the base; and
have a first height; and
a second group of contact pins that:
are arranged in the center region of the base; and
have a second height that is greater than the first height.

4. The socket of claim 2, wherein the base is arched from the border region to the center region such that the center region is elevated relative to the border region.

5. The socket of claim 1, wherein the second side of the contact pins uniformly protrudes a certain height above the base despite the arch of the base.

6. The socket of claim 5, wherein the certain height above the base comprises a length of approximately 200 microns above the base.

7. The socket of claim 1, wherein the electrical component comprises a Land Grid Array (LGA) component whose contact pads electrically couple to the second side of the contact pins that protrudes from the base.

8. The socket of claim 1, wherein the array of contact pins comprises one or more spring-loaded contact pins.

9. The socket of claim 1, wherein;
the border region is elevated a first distance from the circuit board; and
the center region is elevated a second distance from the circuit board, the first distance being greater than the second distance.

10. A system comprising:
a circuit board;
an electrical component that exhibits a certain degree of warpage; and
a socket comprising:
a base that is arched along a continuous gradient to match the certain degree of warpage exhibited by the electrical component; and
an array of contact pins arranged across the base, wherein:
a first side of the contact pins is electrically coupled to the circuit board;
a second side of the contact pins protrudes from the base opposite the circuit board to establish contact with the electrical component despite the certain degree of warpage exhibited by the electrical component; and
the array of contact pins have varying heights that:
follow the arch of the base; and
gradually increase from a border region of the base toward a center region of the base along the continuous gradient.

11. The system of claim 10, wherein:
the border region is elevated a first distance from the circuit board; and
the center region is elevated a second distance from the circuit board, the second distance being greater than the first distance.

12. The system of claim 11, wherein the array of contact pins comprises:
a first group of contact pins that:
are arranged in the border region of the base; and
have a first height; and
a second group of contact pins that:
are arranged in the center region of the base; and
have a second height that is greater than the first height.

13. The system of claim 11, wherein the array of contact pins have varying heights that:
follow the arch of the base; and
gradually increase from the border region of the base toward the center region of the base.

14. The system of claim 11, wherein the base is arched from the border region to the center region such that the center region is elevated relative to the border region.

15. The system of claim 10, wherein the second side of the contact pins uniformly protrudes a certain height above the base despite the arch of the base.

16. The system of claim 15, wherein the certain height above the base comprises a length of approximately 200 microns above the base.

17. The system of claim 10, wherein the electrical component comprises a Land Grid Array (LGA) component whose contact pads electrically couple to the second side of the contact pins that protrudes from the base.

18. The system of claim 10, wherein the array of contact pins comprises one or more spring-loaded contact pins.

19. A method comprising:
determining a degree of warpage experienced by an electrical component that includes an array of contact pads;
manufacturing a socket that includes:
a base that is arched along a continuous gradient to match the degree of warpage experienced by the electrical component; and
an array of contact pins that extend from the base, the array of contact pins have varying heights that:
follow the arch of the base; and
gradually increase from a border region of the base toward a center region of the base along the continuous gradient;
electrically coupling the socket to a circuit board via a first side of the contact pins; and
installing the electrical component into the socket such that a second side of the contact pins establishes contact with the array of contact pads included on the electrical component.

\* \* \* \* \*